United States Patent
Inaba (10) Patent No.: US 8,129,798 B2
(45) Date of Patent: Mar. 6, 2012

(54) SEMICONDUCTOR DEVICE COMPRISING FULLY-DEPLETED AND PARTIALLY-DEPLETED FINFETS

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 12/629,998

(22) Filed: Dec. 3, 2009

(65) Prior Publication Data

US 2010/0237436 A1 Sep. 23, 2010

(30) Foreign Application Priority Data

Mar. 23, 2009 (JP) ................................ 2009-070257

(51) Int. Cl.
*H01L 27/088* (2006.01)
(52) U.S. Cl. ................ 257/392; 257/365; 257/E21.415; 438/283
(58) Field of Classification Search .................. 257/365, 257/392, E21.415; 438/294
See application file for complete search history.

(56) References Cited

U.S. PATENT DOCUMENTS

| | | | |
|---|---|---|---|
| 6,720,619 B1 * | 4/2004 | Chen et al. ..................... | 257/347 |
| 6,867,460 B1 * | 3/2005 | Anderson et al. ............. | 257/351 |
| 7,301,210 B2 * | 11/2007 | Abadeer et al. ............... | 257/401 |
| 7,456,472 B2 | 11/2008 | Inaba | |
| 7,456,476 B2 * | 11/2008 | Hareland et al. .............. | 257/349 |
| 7,522,445 B2 | 4/2009 | Inaba | |
| 2007/0108528 A1 * | 5/2007 | Anderson et al. ............. | 257/365 |
| 2008/0253170 A1 | 10/2008 | Inaba | |
| 2009/0174000 A1 * | 7/2009 | Ohguro ......................... | 257/368 |

OTHER PUBLICATIONS

Ryuta Tsuchiya et al., "Controllable Inverter Delay and Suppressing Vth Fluctuation Technology in Silicon on Thin BOX Featuring Dual Back-Gate Bias Architecture", 2007 IEEE, 2 pages.

* cited by examiner

Primary Examiner — Wael Fahmy
Assistant Examiner — John C Ingham
(74) Attorney, Agent, or Firm — Oblon, Spivak, McClelland, Maier & Neustadt, L.L.P.

(57) ABSTRACT

A semiconductor device includes a circuit comprising a first transistor in a first Fin; a power supply circuit in a second Fin, the power supply circuit comprising a second transistor connected between the circuit and a power supply line; and a substrate contact electrically connected to the semiconductor substrate and configured to apply a substrate voltage to a substrate, wherein a width of the first Fin in a cross-section of the first Fin perpendicular to a channel length direction of the first transistor is equal to or smaller than a twofold of a largest depletion layer width of a depletion layer formed in a channel part of the first transistor, and a width of the second Fin in a cross-section of the second Fin perpendicular to a channel length direction of the second transistor is larger than a twofold of a largest depletion layer width of a depletion layer in a channel of the second transistor.

21 Claims, 11 Drawing Sheets

SEMICONDUCTOR DEVICE COMPRISING FULLY-DEPLETED AND PARTIALLY-DEPLETED FINFETS

CROSS-REFERENCE TO RELATED APPLICATION

This application is based upon and claims the benefit of priority from the prior Japanese Patent Applications No. 2009-70257, filed on Mar. 23, 2009, the entire contents of which are incorporated herein by reference.

BACKGROUND

In recent years, there has been proposed a technique of using a double-gate Fin-MOSFET (hereinafter, also "Fin-FET") as a fully-depleted channel MOSFET (hereinafter, also "FD transistor"). The FinFET serving as an FD transistor is advantageous over an FD planar transistor in suppression of a short channel effect and therefore it is suited for device downscaling.

Meanwhile, there has been proposed a technique for dynamically controlling a threshold voltage of a semiconductor device typified by a MOSFET by applying a temporally changing substrate voltage to a partial well of the MOSFET or a technique (power gating) for controlling a threshold voltage of a switching transistor by applying a substrate voltage to a well and cutting off a power supply line itself. In an examples of the latter technique (power gating), the substrate voltage allows easily to turn off a power switching transistor for low power consumption when the MOSFET is on a standby state.

However, it is difficult to control the threshold voltage of an FD transistor by a substrate voltage for the following reason. In case of an FD planar MOSFET (R. Tsuchiya et al, "Controllable Inverter Delay and Suppressing Vth Fluctuation Technology in Silicon on Thin BOX Featuring Dual Back-Gate Bias Architecture", International Electron Devices Meeting (IEDM) 2007, 475-478) or FD FinFET formed on an SOI (Silicon On Insulator) substrate, a substrate bias cannot be applied to a channel part due to its structure. Further, when the substrate voltage is applied via the well region, it is also difficult to control threshold voltage only for the power switching transistor without influencing the other transistors in a logic circuit.

In case of an FD MOSFET formed on a thin film SOI substrate, it is necessary to provide a thin film BOX (Buried Oxide) layer right under the channel part so as to control the threshold voltage or the like using the substrate voltage. However, the SOI substrate having a thin film BOX layer formed thereon is generally expensive, considering the total manufacturing cost.

Accordingly, it is disadvantageously difficult to selectively control the threshold voltage of the power switching transistor in the logic circuit constituted by FD transistors or costs increase disadvantageously. That is, it has been difficult to apply the power gating technique to a logic circuit constituted by FD transistors.

SUMMARY

A semiconductor device according to an embodiment of the present invention comprises: a semiconductor substrate; an electric circuit comprising a first transistor in a first Fin region on the semiconductor substrate; a power supply circuit in a second Fin region on the semiconductor substrate, the power supply circuit comprising a second transistor connected between the electric circuit and a power supply line; and a substrate contact electrically connected to the semiconductor substrate and configured to apply a substrate voltage to the semiconductor substrate, wherein a Fin width of the first Fin region in a cross section of the first Fin region perpendicular to a channel length direction of the first transistor is equal to or smaller than a twofold of a largest depletion layer width of a depletion layer formed in a channel part of the first transistor, and a Fin width of the second Fin region in a cross section of the second Fin region perpendicular to a channel length direction of the second transistor is larger than a twofold of a largest depletion layer width of a depletion layer in a channel part of the second transistor.

DETAILED DESCRIPTION

Embodiments of the present invention will be explained below in detail with reference to the accompanying drawings. Note that the invention is not limited thereto.

First Embodiment

Figure 1:
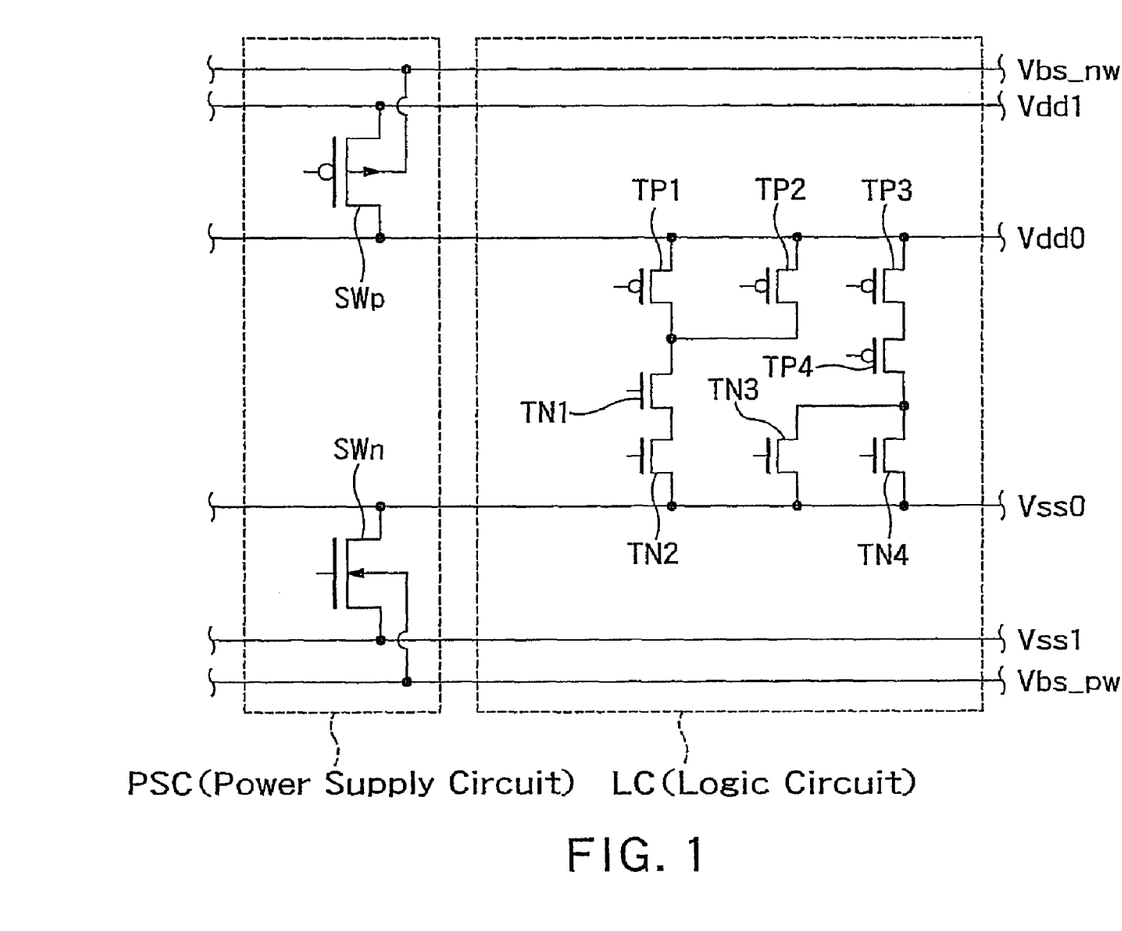
FIG. 1 is a circuit diagram showing a logic circuit part and a power supply part according to a first embodiment.

FIG. 1 is a circuit diagram showing a logic circuit part and a power supply part according to a first embodiment. A logic circuit LC comprises p-Fin transistors TP1 to TP4 and n-Fin transistors TN1 to TN4. FIG. 1 shows that the logic circuit LC is configured to arrange a NAND circuit and a NOR circuit in parallel. However, the configuration of the logic circuit is not limited to that shown in FIG. 1, and the logic circuit can be configured arbitrarily as long as the logic circuit operates in response to supply of power from a power supply circuit PSC.

The power supply circuit PSC serving as the power supply part comprises a p-switching transistor SWp and an n-switching transistor SWn.

Vss0 is a ground potential of the logic circuit LC. Vdd0 is a power supply voltage of the logic circuit LC. Vss1 is a voltage source of a voltage lower than Vss0. Vdd1 is a voltage source of a voltage higher than Vdd0.

Vbs_nw is electrically connected to an n-well and higher in potential than Vdd1. Vbs_pw is electrically connected to a p-well and lower in potential than Vss1. Vbs_nw is applied to the switching transistor SWp as a substrate bias voltage. Vbs_pw is applied to the switching transistor SWn as a substrate bias voltage.

The switching transistor SWp is connected between the power supplies Vdd1 and Vdd0. That is, the switching transistor SWp is connected between the power supply Vdd1 and the logic circuit LC. When the switching transistor SWp is turned on, electric power is supplied from the Vdd1 to the Vdd0. The switching transistor SWn is connected between the electric power supplies Vss1 and Vss0. That is, the switching transistor SWn is connected between the electric power supply Vss1 and the logic circuit LC. When the switching transistor SWn is turned on, electric power is supplied from the Vss1 to the Vss0. The Vdd0 and Vss0 are used as power supply voltages for the logic circuit LC.

Figure 2:
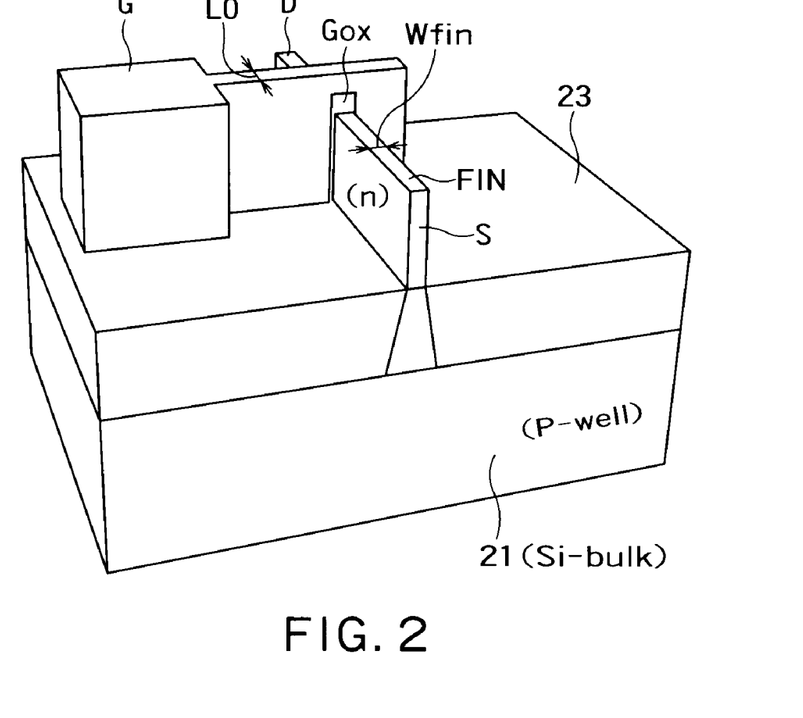
FIG. 2 is a perspective view showing a configuration of one bulk FinFET.

FIG. 2 is a perspective view showing a configuration of one bulk FinFET. When the bulk FinFET is an n-channel transistor, the bulk FinFET comprises a Fin region connected to a p-silicon bulk substrate (p-well) 21 serving as a semiconductor bulk substrate. The Fin region is formed by working the bulk substrate 21 to have protrusions and made of the same silicon material as that of the substrate 21. The Fin region is used as an active area. A height of the Fin region is, for example, about 0.1 micrometer (μm) to 0.2 μm. However, the Fin region is possibly lower than about 0.1 μm. A device isolation film 23 serving as device isolation region is formed on each side of the Fin region on the substrate 21. The Fin region can be also used as either a first Fin region or a second Fin region.

A gate electrode G is provided on an upper surface and side surfaces of the Fin region via a gate dielectric film Gox. When the FinFET is an n-FET, the gate electrode G can be formed out of doped polysilicon containing As (arsenic) and P (phosphorus), metal or a combination of the doped polysilicon and the metal. When the gate electrode G is formed out of the doped polysilicon, a threshold voltage of the FD transistor is high. It is, therefore, preferable to form the gate electrode G of the FD transistor out of metal. Because a threshold voltage of the FinFET with a metal gate G can be decided by a work function of the metal gate G, the threshold voltage can be set low by selecting an appropriate material for the metal gate.

The gate dielectric film Gox is, for example, a silicon oxide film or a silicon oxide nitride film formed by thermal oxidation, a high dielectric film (such as HfSiO) or a multilayer of these films.

An n-type source electrode S is provided on one half of the Fin region present on both sides of the gate electrode G whereas an n-type drain electrode D is provided on the other half thereof. While FIG. 2 shows the n-FinFET, a p-FinFET can be obtained by setting conduction types of a semiconductor part opposite.

Figure 3A:
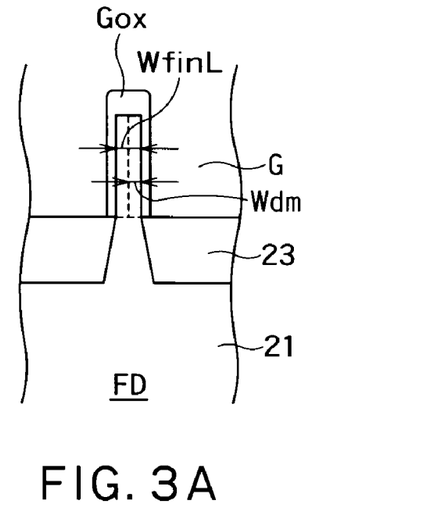
FIGS. 3A and 3B are a cross-sectional view of the Fin region constituting the logic circuit LC and peripheries of the Fin region, and a cross-sectional view of the Fin region of constituting the power supply circuit PSC and peripheries of the Fin region.

FIG. 3A is a cross-sectional view of the Fin region of each of the transistors TP1 to TP4 and TN1 to TN4 constituting the logic circuit LC and peripheries of the Fin region according to the first embodiment. It is assumed that a Fin width of a logic circuit PC-side Fin region is WfinL and that of a power supply circuit PSC-side Fin region is WfinP.

In each of the transistors TP1 to TP4 and TN1 to TN4, the Fin width WfinL of the Fin region in a cross section perpendicular to a direction of a channel length L0 is equal to or smaller than a twofold of a largest depletion layer width Wdm of depletion layers formed in a channel part of each of the transistors TP1 to TN4. The largest depletion layer width Wdm is defined as a largest width of depletion layers extending from both side surfaces of the Fin region in a direction of the largest depletion layer width WfinL in normal operation.

Wdm is decided by several factors, such as an impurity concentration of the Fin region, a thickness of the gate dielectric film GOX, a voltage applied to the gate electrode G and the like. Because the width WfinL is equal to or smaller than the twofold of Wdm, the depletion layer extending from one side surface of the Fin region contacts with the depletion layer extending from the other side surface of the Fin region in an intermediate portion of the Fin region. As a result, the transistors TP1 to TP4 and TN1 to TN4 constituting the logic circuit LC function as fully-depleted (FD) channel transistors.

Figure 3B:
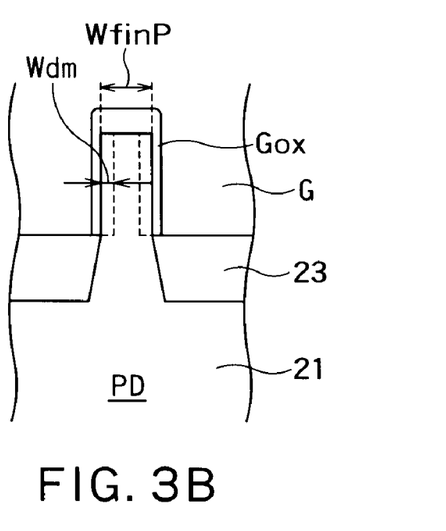

FIG. 3B is a cross-sectional view of the Fin region of each of the switching transistors SWn and SWp constituting the power supply circuit PSC and peripheries of the Fin region according to the first embodiment. In each of the switching transistors SWn and SWp, the Fin width WfinP of the Fin region in the cross section perpendicular to the direction of a channel length L0 is larger than the twofold of Wdm of depletion layers formed in a channel part of each of the switching transistors SWn and SWp. Therefore, as shown in FIG. 3B, the channel part of each of the switching transistors SWn and SWp is not fully depleted. As a result, each of the switching transistors SWn and SWp constituting the power supply circuit PSC functions as a partially-depleted channel MOSFET (hereinafter, also "PD transistor") having a body part electrically connected to substrate contacts SBCp or SBCn. It is to be noted that the body part is present under the gate electrode G and a substrate part in which a channel is formed.

Figure 4A:
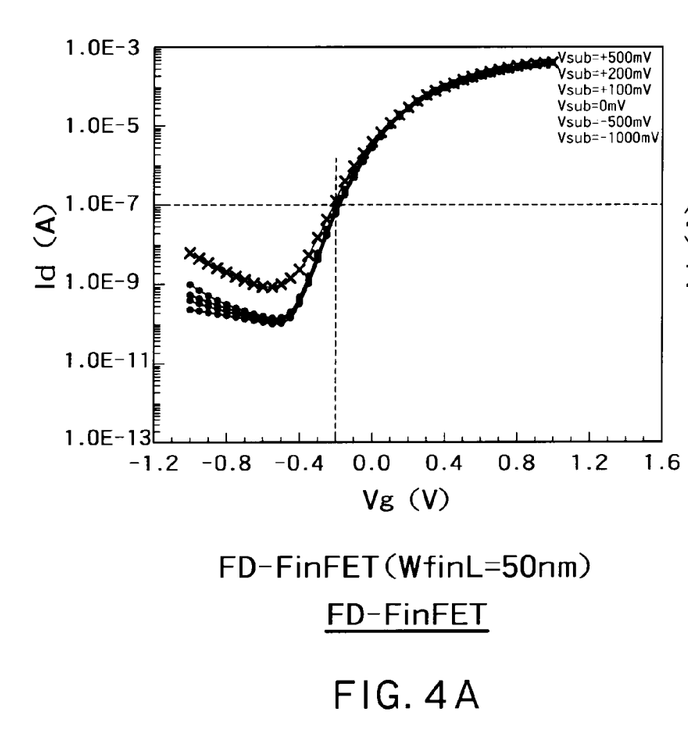
FIGS. 4A and 4B are graphs showing Id-Vg characteristics of the bulk FinFET when a substrate bias voltage Vsub is changed.
Figure 4B:
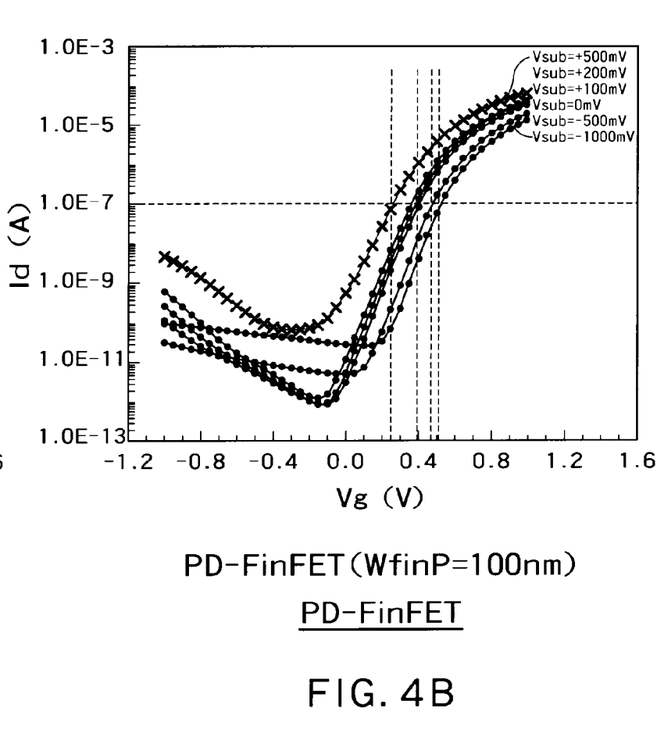

With reference to FIGS. 4A and 4B, the reason for configuring the logic circuit LC to comprise the FD transistors and the power supply circuit PSC to comprise the PD transistors is described below. FIGS. 4A and 4B are graphs showing Id-Vg characteristics of the bulk FinFET when a substrate bias voltage Vsub is changed. Id indicates a drain current and Vg indicates a gate voltage. FIG. 4A shows characteristics of an n-FD transistor having the Fin width WfinL of 50 nanometers (nm). FIG. 4B shows characteristics of an n-PD transistor having the Fin width WfinP of 100 nm and having a so-called body part electrically connected to the substrate contact SBCp.

As shown in FIG. 4A, even if the substrate bias voltage Vsub is changed, the threshold voltage of the FD FinFET hardly changes. When the gate voltage Vg is defined as the threshold voltage with respect to the drain current Id of $1.0 \times 10^{-7}$ ampere, the threshold voltage of the FD FinFET is about $-0.2$ V irrespectively of the substrate bias voltage Vsub.

In an experiment shown in FIGS. 4A and 4B, a polysilicon gate electrode is used as the gate electrode G of the n-FinFET. Due to this, the threshold voltage is negative. However, by using the metal gate electrode having an appropriate work function, this threshold voltage of the n-FinFET can satisfy a threshold voltage of an ordinary enhancement-mode transistor.

On the other hand, as shown in FIG. 4B, when the substrate bias voltage Vsub is changed, the threshold voltage of the PD FinFET changes. When the substrate bias Vsub is changed, for example, from $-1$ volt (V) to 0.5 V, the threshold voltage of the PD FinFET changes from about 0.27 V to 0.52 V.

As can be seen from FIG. 4A, the transistors TP1 to TP4 and TN1 to TN4 constituting the logic circuit LC are not influenced by the substrate bias voltages Vbs_nw and Vbs_pw (also, "Vsub" collectively). That is, it is possible to set an operating rate of the logic circuit substantially fixed because the threshold voltage has no change irrespective of the substrate bias voltage Vsub. This indicates that it is difficult to give influence of substrate noise on the logic circuit L.

On the other hand, as can be seen from FIG. 4B, the substrate voltage Vsub can control the threshold voltage of each of the switching transistors SWp and SWn constituting the power supply circuit PSC.

Accordingly, even if the transistors TN1 to TN4 of the logic circuit LC and the switching transistor SWn of the power supply circuit PSC are formed as the same p-well transistors, the threshold voltage of the switching transistor SWn of the power supply circuit PSC can be reduced using the substrate bias voltage Vsub without influence on high-rate operation of the transistors TN1 to TN4 of the logic circuit LC. As a result, while the logic circuit LC is operating at a high speed, current driving capability of the switching transistor SWn can be improved.

Meanwhile, when the logic circuit LC is operating at a low speed, on standby or stopping, the threshold voltage of the switching transistor SWn constituting the power supply circuit PSC can be raised using the substrate bias voltage Vsub. As a result, the power supply circuit PSC can cut off the logic circuit LC at sufficiently high resistance from the power supply voltages Vdd1 and Vss1. That is, according to the present invention, it is possible to improve the current driving capability and cutoff characteristics of the power supply circuit PSC using the substrate bias voltage Vsub without influence on the logic circuit LC. Needless to say, similar effects can be attained on the n-well side.

In this way, according to the first embodiment, the p-transistors TP1 to TP4 are formed on the same n-well as that on which the switching transistor SWp is formed. However, because the p-transistors TP1 to TP4 are FD FinFETs, the power supply voltage Vbs_nw hardly influences the p-transistors TP1 to TP4 and threshold voltages of the p-transistors TP1 to TP4 are hardly changed by applying the substrate bias voltage Vsub. On the other hand, the switching transistor SWp is a Fin transistor but not an FD transistor. Therefore, it is possible to control the threshold voltage of the switching transistor SWp by applying the substrate bias voltage Vsub from the power supply Vdd1.

The n-transistors TN1 to TN4 are formed on the same p-well as that on which the switching transistor SWn is formed. However, because the n-transistors TN1 to TN4 are FD FinFETs, the power supply voltage Vbs_pw hardly influences the n-transistors TN1 to TN4 and threshold voltages of the n-transistors TN1 to TN4 are hardly changed by applying the substrate bias voltage Vsub. On the other hand, the switching transistor SWn is a Fin transistor but not an FD transistor. Therefore, it is possible to control the threshold voltage of the switching transistor SWn by applying the substrate bias voltage Vsub from the power supply Vbs_pw.

For example, when the logic circuit LC is caused to operate at a high speed, then the voltage Vbs_pw is set high to be closer to the Vdd1. An absolute value of the threshold voltage of the switching transistor SWn decreases and current driving capability of the switching transistor SWn improves. Furthermore, the voltage Vbs_nw is set low to be closer to the Vss1. As a result, an absolute value of the threshold voltage of the switching transistor SWp decreases and current driving capability of the switching transistor SWp improves. The voltage Vbs_pw or Vbs_nw at this time is a first substrate voltage.

While the logic circuit LC is on standby, stopping, or operating at a low speed, the voltage Vbs_nw is set high. Accordingly, the absolute value of the threshold voltage of the switching transistor SWp increases and cutoff characteristics of the switching transistor SWp improve. Further, the voltage Vbs_pw is set low. Accordingly, the threshold voltage of the switching transistor SWn increases and cutoff characteristics of the switching transistor SWn improve. As a result, an off-leakage current of each of the switching transistors SWp and SWn can be set closer to zero. The voltage Vbs_pw or Vbs_nw at this time is a second substrate voltage.

Conventional techniques have the following problems (1) to (6). (1) When a planar transistor formed on a bulk substrate is adopted as each of transistors constituting each of the logic circuit and the power supply circuit, cutoff characteristics are deteriorated by the short channel effect resulting from downscaling of the device size. (2) When a planar transistor formed on an SOI substrate is adopted as each of transistors constituting each of the logic circuit and the power supply circuit, it is required to form a device structure using a very thin BOX layer so as to control threshold by applying a substrate bias voltage. Because of particularity of the substrate, manufacturing cost should increase. (3) When metal gates having work functions suitable for a p-FET and an n-FET, respectively are adopted for adjustment of a threshold voltage, it is difficult in the manufacturing process to separate work functions of a plurality of transistors proximate to one another. It is, therefore, difficult to separately adjust threshold voltages of the proximate transistors with metal gates. (4) When an impurity concentration of a channel part of each transistor is to be changed, it is difficult to separately adjust the threshold voltages of the proximate transistors similarly to (3). (5) When an FD FinFET having high cutoff characteristics is adopted as each of transistors constituting each of the logic circuit and the power supply circuit, a threshold voltage of the FD FinFET cannot be controlled using the substrate bias voltage. (6) It can be considered to adopt a FinFET in which gate electrodes on both side surfaces of the FinFET are used not as double gates but are separated from each other and controlled as separate gates independently. However, such an FD FinFET having a single gate structure cannot exhibit an effect of suppression the short channel effect as exhibited by the FinFET having the double-gate structure.

On the other hand, the semiconductor device according to the first embodiment has the following advantages (1) to (6). (1) Because the FinFET is adopted as each of the transistors constituting each of the logic circuit LC and the power supply circuit PSC, the semiconductor device according to the first embodiment can suppress the short channel effect. (2) Because the same bulk substrate as in conventional MOSFET is used, the semiconductor device according to the first embodiment can be manufactured at low cost. (3) In the semiconductor device according to the first embodiment, the influence of the substrate bias voltage Vsub can be selectively exerted only on the power supply circuit PSC. That is, the threshold voltages of a plurality of transistors proximate to one another can be independently adjusted. (4) In the semiconductor device according to the first embodiment, there is no need to change the impurity concentration of the channel part of each transistor. (5) In the semiconductor device according to the first embodiment, the logic circuit LC is constituted by the FD FinFETs and the power supply circuit PSC is constituted by the PD FinFETs. Due to this, the substrate bias voltage Vsub can selectively control only the power supply circuit PSC. (6) In the semiconductor device according to the first embodiment, the FinFETs having the double-gate structure are employed and the short channel effect can be, therefore, suppressed. In this way, the semiconductor device according to the first embodiment can solve all the conventional problems (1) to (6).

Figure 5:
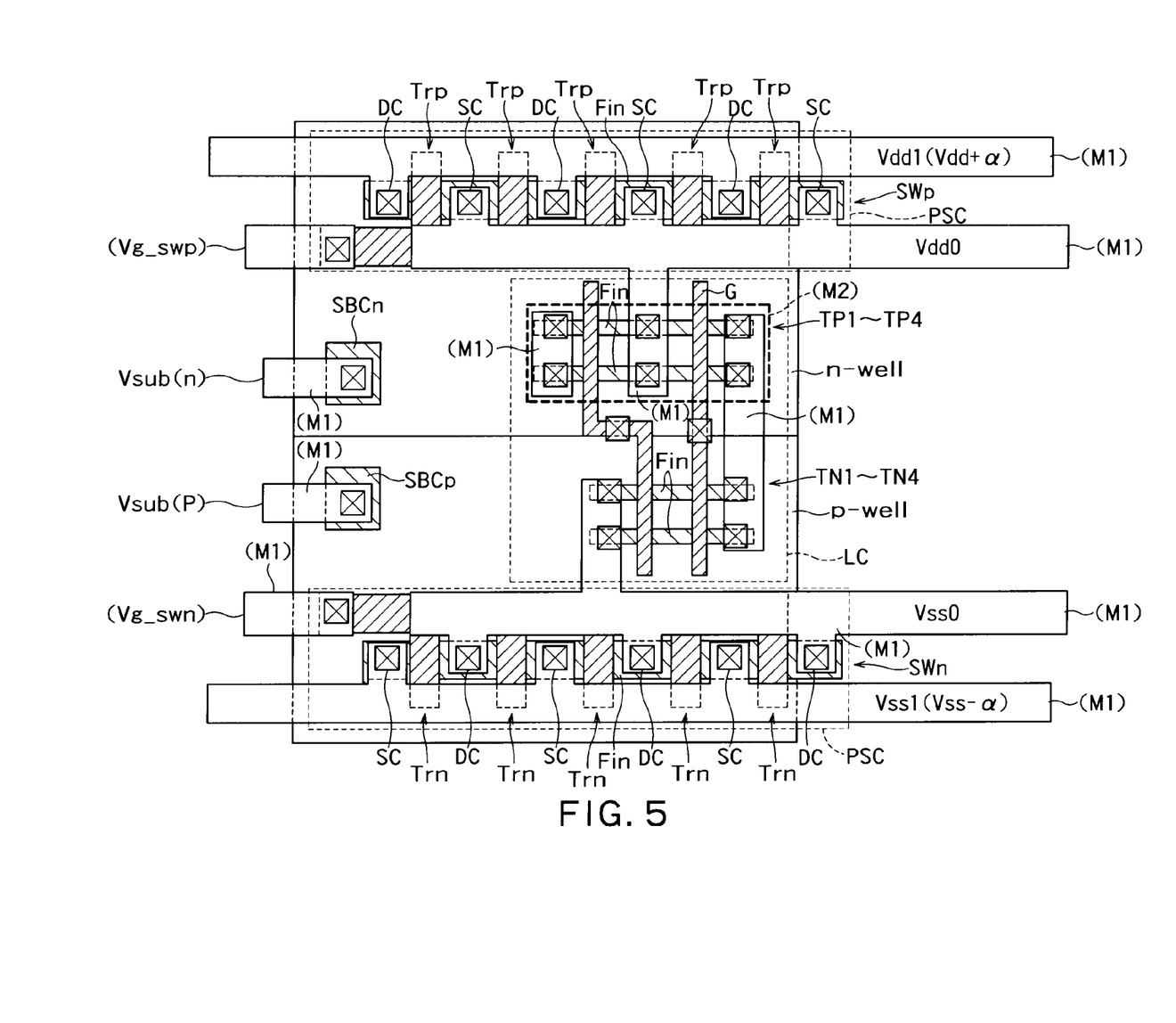
FIG. 5 is a layout view showing one example of a configuration of the semiconductor device according to the first embodiment.

FIG. 5 is a layout view showing one example of a configuration of the semiconductor device according to the first embodiment. FIG. 5 shows a two-input NAND circuit. Wirings of parts connected to the two inputs are not shown in FIG. 5. Further, a positional relationship between the power supply circuit PSC and the logic circuit LC is not limited to that shown in FIG. 5. The switching transistors SWp and SWn can be provided at different locations from those in the logic circuit LC.

The p-transistors TP1 to TP4 of the logic circuit LC and the p-switching transistor SWp of the power supply circuit PSC are formed on the same n-well. The n-transistors TN1 to TN4 of the logic circuit LC and the n-switching transistor SWn of the power supply circuit PSC are formed on the same p-well.

The logic circuit LC is shown in a central portion in FIG. 5. The switching transistors SWp and SWn are shown in upper and lower portions in FIG. 5, respectively. The substrate contacts SBCn and SBCp are provided on the n-well and p-well so as to apply the substrate bias voltages Vbs_nw or Vbs_pw to the bulk substrate (n-well and p-well), respectively. The substrate bias voltage Vbs_nw shown in FIG. 1 is applied to the n-well via the substrate contact SBCn. The substrate bias voltage Vbs_pw shown in FIG. 1 is applied to the p-well via the substrate contact SBCp.

In the layout of FIG. 5, a longitudinal direction of the Fin region of each of the switching transistors SWn and SWp is substantially in parallel to that of the Fin region of each of the transistors TP1 to TP4 and TN1 to TN4. Therefore, in this layout, the both Fin region are uniform in extension direction, thereby facilitating working the Fin region.

The switching transistor SWp is arranged in the longitudinal direction of the Fin region and comprises a plurality of switching elements Trp connected in parallel. Two adjacent switching elements Trp share the source S or drain D therebetween.

The switching transistor SWn is arranged in the longitudinal direction of the Fin region and comprises a plurality of switching elements Trn connected in parallel. Two adjacent switching elements Trn share the source S or drain D therebetween. Such a layout enables an effective channel width of each of the switching transistors SWp and SWn to be set sufficiently larger than that of each of the transistors TP1 to TP4 and TN4 to TN4. As a result, the power supply circuit PSC can supply sufficiently high power to the logic circuit LC while the logic circuit LC is operating.

The logic circuit LC suppresses a junction capacity and a mirror capacity in the drain of each switching element Trn. It is, therefore, preferable to share one drain D between the two adjacent switching elements Trn.

Moreover, an effective channel length of each of the switching transistors SWp and SWn is set equal to or slightly larger than that of each of the transistors TP1 to TP4 and TN1 to TN4. By so setting, the short channel effect of the switching transistors SWp and SWn is suppressed while the logic circuit LC is on standby or stopping. It is thereby possible to set an off-current sufficiently low.

Figure 6:
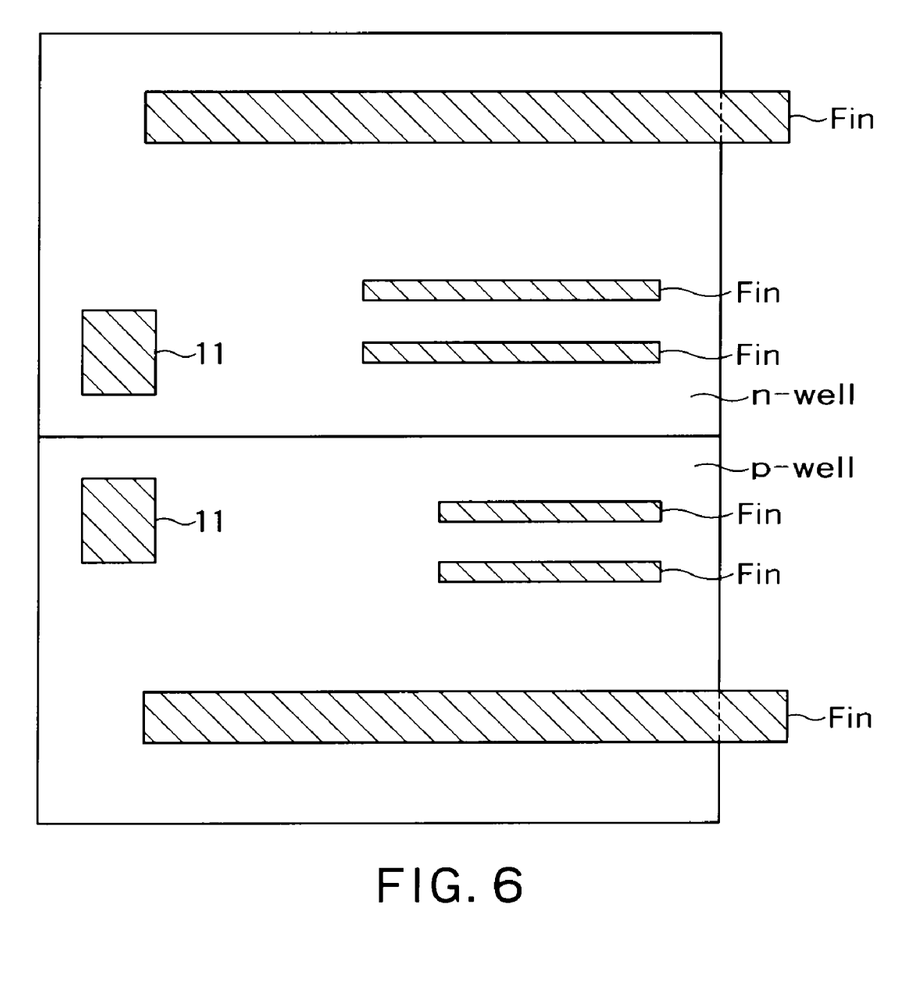
FIGS. 6 to 8 are plane layout views showing a method of manufacturing the semiconductor device according to the first embodiment.
Figure 7:
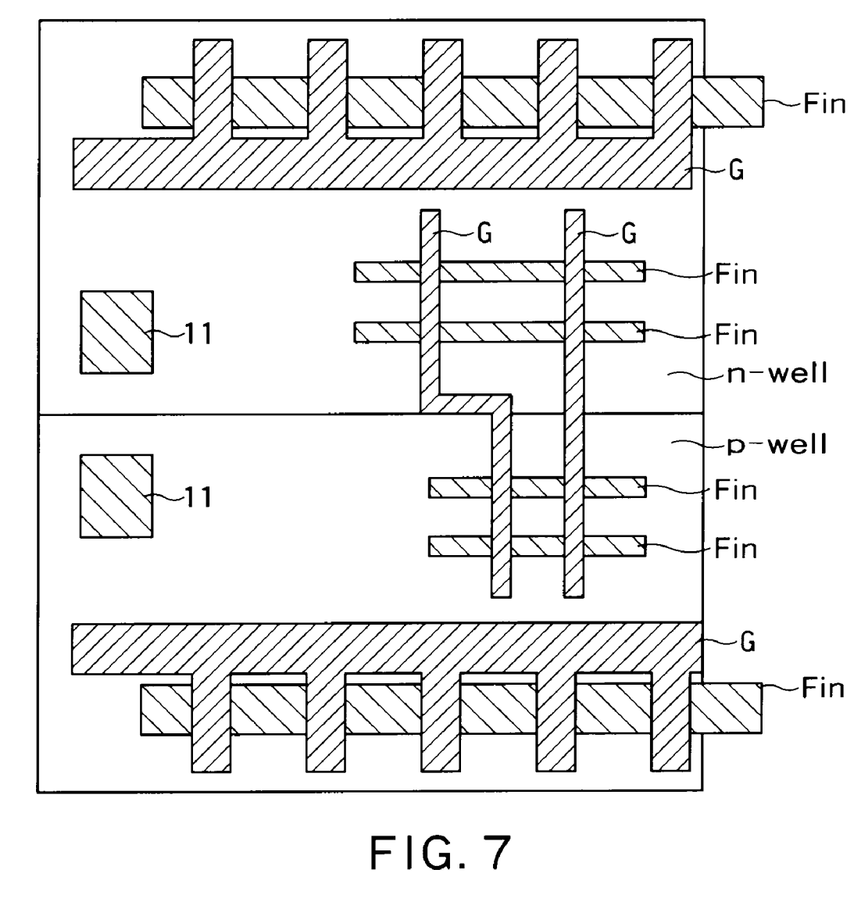
Figure 8:
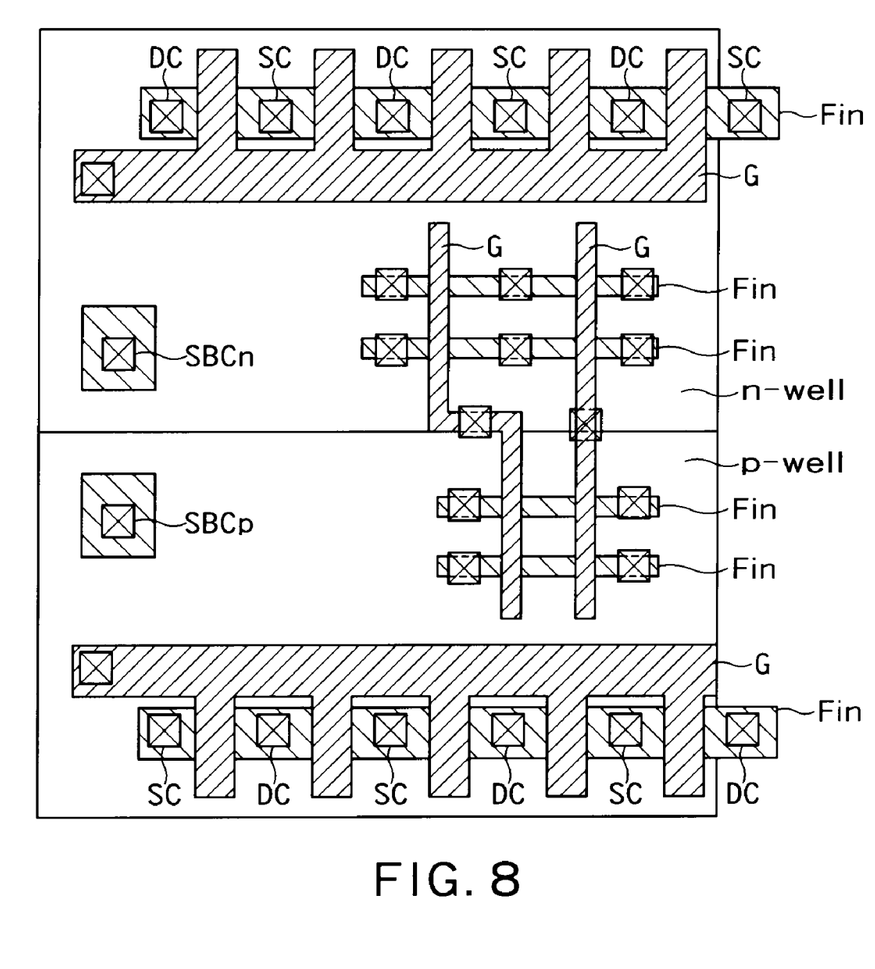

FIGS. 6 to 8 are plane layout views showing a method of manufacturing the semiconductor device according to the first embodiment. First, the bulk substrate is prepared. As shown in FIG. 6, the n-well and p-well are formed in the bulk substrate. A surface of the bulk substrate is worked to thereby form Fin regions. At this time, the Fin regions are identical in longitudinal direction. Therefore, the surface of the bulk substrate can be worked relatively easily using lithography and etching.

As shown in FIGS. 3A and 3B, Fin regions are formed so that the width WfinP of each Fin region in a power supply circuit region is smaller than the width WfinL of each Fin region in a logic circuit region.

The gate dielectric film (not shown in FIGS. 6 to 8) is formed on the side surfaces and upper surface of each Fin region. As shown in FIG. 7, the gate electrode G is formed on the side surfaces and upper surface of each Fin region via the gate dielectric film. However, the gate dielectric film on the upper surface of each Fin region can be formed thicker than that on the side surfaces thereof. By doing so, the upper surface of each Fin region is not inverted. If the upper surface of each Fin region is used as a channel and if the Fin height is high, punch-through possibly occurs.

The gate electrode G of each of the switching transistors SWp and SWn is patterned into a comb shape. Comb-like teeth patterns are thereby provided on the side surfaces and upper surface of each Fin region.

Next, using the gate electrode G as a mask, impurities are implanted into each Fin region, thereby forming the source S and drain D in the Fin region on both sides of the gate electrode G, respectively.

An interlayer dielectric film (not shown) is then deposited on the gate electrode G, each Fin region, and the bulk substrate. The interlayer dielectric film is worked to form contact holes at x positions shown in FIG. 8, respectively. Metal is buried into each contact hole, thereby forming a contact. In the switching transistors SWp and SWn, source contacts SC and drain contacts DC are alternately formed. At this time, the substrate contacts SBCn and SBCp are also formed.

A first metal layer M1 is then formed. As a result, as shown in FIG. 5, power supply lines for the power supply voltages Vdd0, Vdd1, Vss0, and Vss1 are formed into a comb shape. Further, a wiring of the first metal layer M1 connects the source contact SC of the switching transistor SWp to the power supply line for Vdd0, and connects the drain contact SC of the switching transistor SWp to the power supply line for Vdd1. In addition, the wiring of the first metal layer M1 connects the source contact SC of the switching transistor SWn to the power supply line for Vss1, and connects the drain contact SC of the switching transistor SWn to the power supply line for Vss0. Further, the wiring of the first metal layer M1 connects a part of the contacts of the transistors TP1 to TP4 of the logic circuit LC to the power supply line for Vss0, and connects a part of the contacts of the transistors TN1 to TN4 of the logic circuit LC to the power supply line for Vdd0. Moreover, the wiring of the first metal layer M1 connects the substrate contacts SBCn and SBCp to a substrate bias circuit (not shown) to apply the substrate bias voltage Vsub.

Next, to appropriately connect the logic circuit LC and the like, a wiring of a second metal layer M2 or the like is formed above the first metal layer M. Thus, the semiconductor device according to the first embodiment is completed.

Second Embodiment

Figure 9:
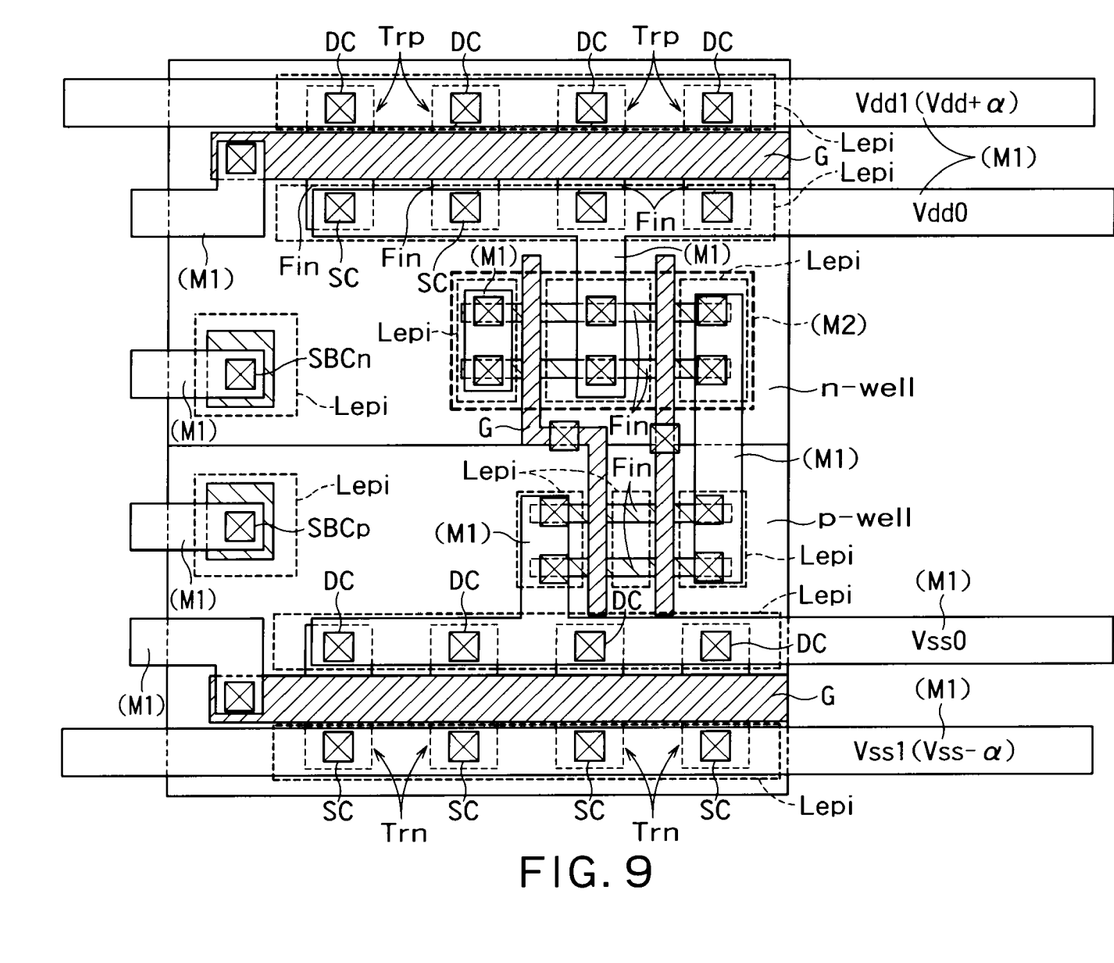
FIG. 9 is a layout view showing a semiconductor device according to a second embodiment.

FIG. 9 is a layout view showing a semiconductor device according to a second embodiment of the present invention. The second embodiment differs from the first embodiment in plane layout of switching transistors SWn and SWp. Other configurations of the second embodiment can be identical to those of the first embodiment.

In the second embodiment, a longitudinal direction of a Fin region of each of the switching transistors SWp and SWn is substantially orthogonal to that of a Fin region of each of transistors TP1 to TP4 and TN1 to TN4 constituting a logic circuit LC. The Fin reion of each of the switching transistors SWp and SWn is separated according to switching elements Trp or Trn. A source S and a drain D are provided for every switching element Trp or Trn.

In the second embodiment similarly to the first embodiment, an effective channel width of each of the switching transistors SWp and SWn is set sufficiently larger than that of each of the transistors TP1 to TP4 and TN4 to TN4. As a result, the power supply circuit PSC can supply sufficiently high power to the logic circuit LC while the logic circuit LC is operating.

Moreover, an effective channel length of each of the switching transistors SWp and SWn is set equal to or slightly larger than that of each of the transistors TP1 to TP4 and TN1 to TN4. It is thereby possible to set an off-current sufficiently low while the logic circuit LC is on standby or stopping.

In the first embodiment, the two adjacent contacts SC and DC sandwich the gate electrode G therebetween. Due to this, a distance between the contacts cannot be narrowed down to a lithographic minimum feature size F. In the second embodiment, by contrast, each Fin region is formed in a direction orthogonal to power supply lines for Vdd0 and Vdd1 and a wiring of a gate electrode G. Due to this, by narrowing a distance between two adjacent source contacts SC and that between two adjacent drain contacts DC, the effective channel width of each of the switching transistors SWn and SWp can be easily increased.

The longitudinal direction of the Fin region of each of the switching transistors SWn and SWp is substantially orthogonal to that of the Fin region of each of transistors TP1 to TP4 and TN1 to TN4. Due to this, it is slightly difficult to work each Fin region in the second embodiment as compared with the first embodiment. However, a width Wfin of the Fin region of each of the switching transistors SWp and SWn is set relatively large so as to increase the effective channel width. Accordingly, it is not so difficult to simultaneously work all the Fin region using lithography and RIE.

Further, the second embodiment can achieve effects similar to those of the first embodiment.

Figure 10:
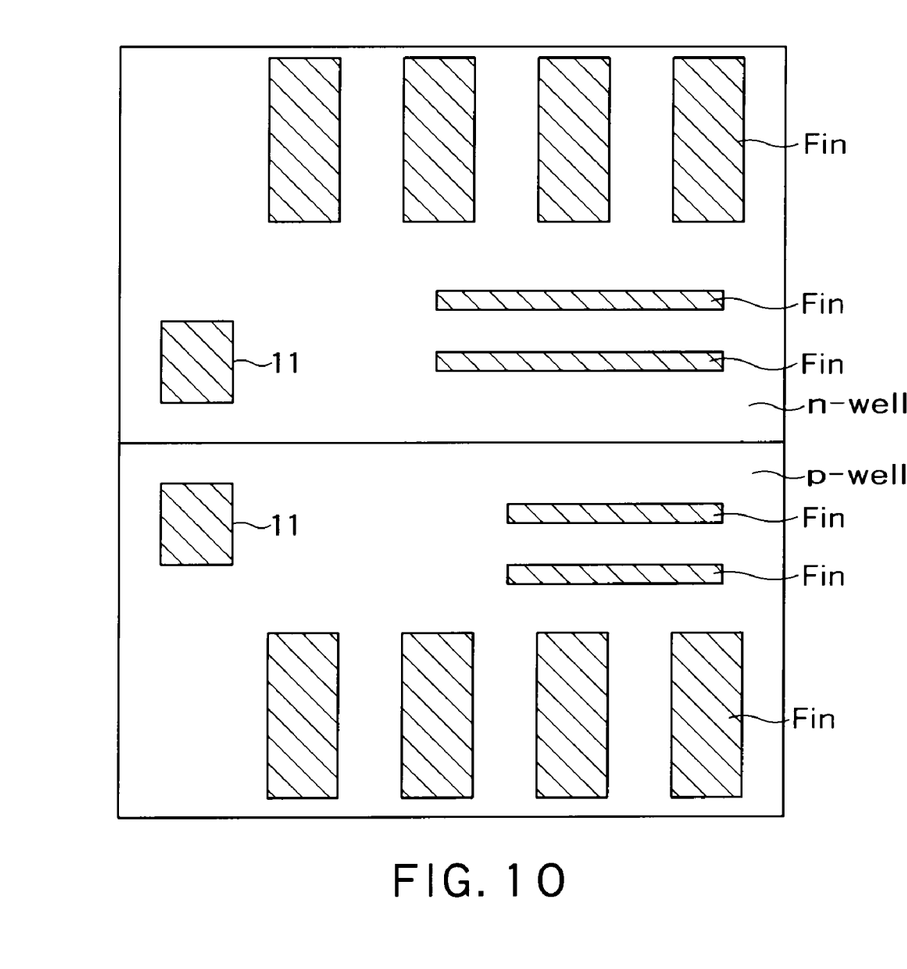
FIGS. 10 to 11 are plane layout views showing a method of manufacturing the semiconductor device according to the second embodiment.
Figure 11:
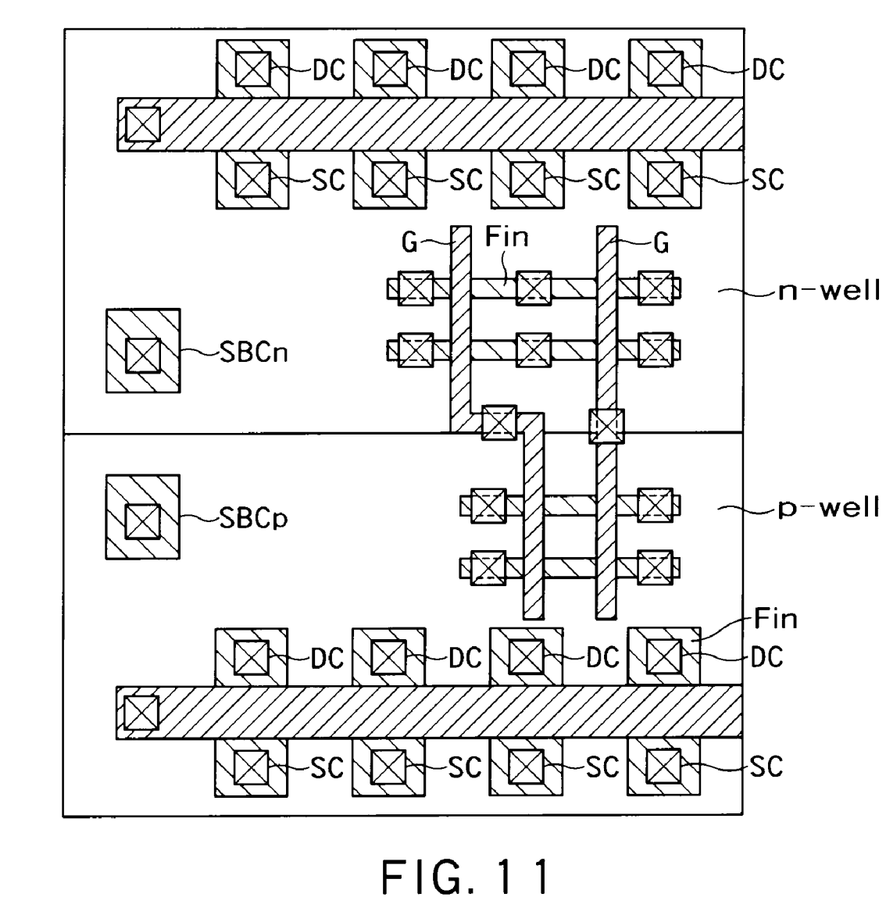

With reference to FIGS. 10 and 11, a method of manufacturing the semiconductor device according to the second embodiment is described next. Similarly to the first embodiment, an n-well and a p-well are formed in a bulk substrate.

Next, as shown in FIG. 10, a surface of the bulk substrate is worked to form Fin region. At this time, the longitudinal direction of the Fin region of each of the switching transistors SWp and SWn constituting the power supply circuit PSC is substantially orthogonal to that of the Fin region of each of the transistors TP1 to TP4 and TN1 to TN4 constituting the logic circuit LC.

A gate dielectric film (not shown in FIGS. 10 to 11) is then formed on side surfaces and upper surface of each Fin region. As shown in FIG. 11, the gate electrode G is formed on the side surfaces and upper surface of each Fin region via the gate dielectric film. The gate electrode G of each of the switching transistors SWp and SWn is patterned linearly. Therefore, the gate electrode G is easier to work than that in the first embodiment.

Next, similarly to the first embodiment, the source S and drain D are formed in each Fin region on both sides of the gate electrode G.

After depositing an interlayer dielectric film (not shown), contact holes are formed at x positions shown in FIG. 11, respectively. Metal is buried into each contact hole, thereby forming a contact. At this time, substrate contacts SBCn and SBCp are also formed.

A first metal layer M1 is then deposited and patterned. As a result, as shown in FIG. 9, power supply lines for power supply voltages Vdd0, Vdd1, Vss0, and Vss1 are formed. The source contacts SC and drain contacts DC of the switching transistors SWp and SWn are aligned in an extension direction of the gate electrode G. Therefore, it suffices to form the power supply lines for the power supply voltages Vdd0, Vdd1, Vss0, and Vss1 linearly and can be worked more easily than those in the first embodiment.

Thereafter, process steps identical to those in the first embodiment are performed, and the semiconductor device according to the second embodiment is completed.

First Modification

Figure 12:
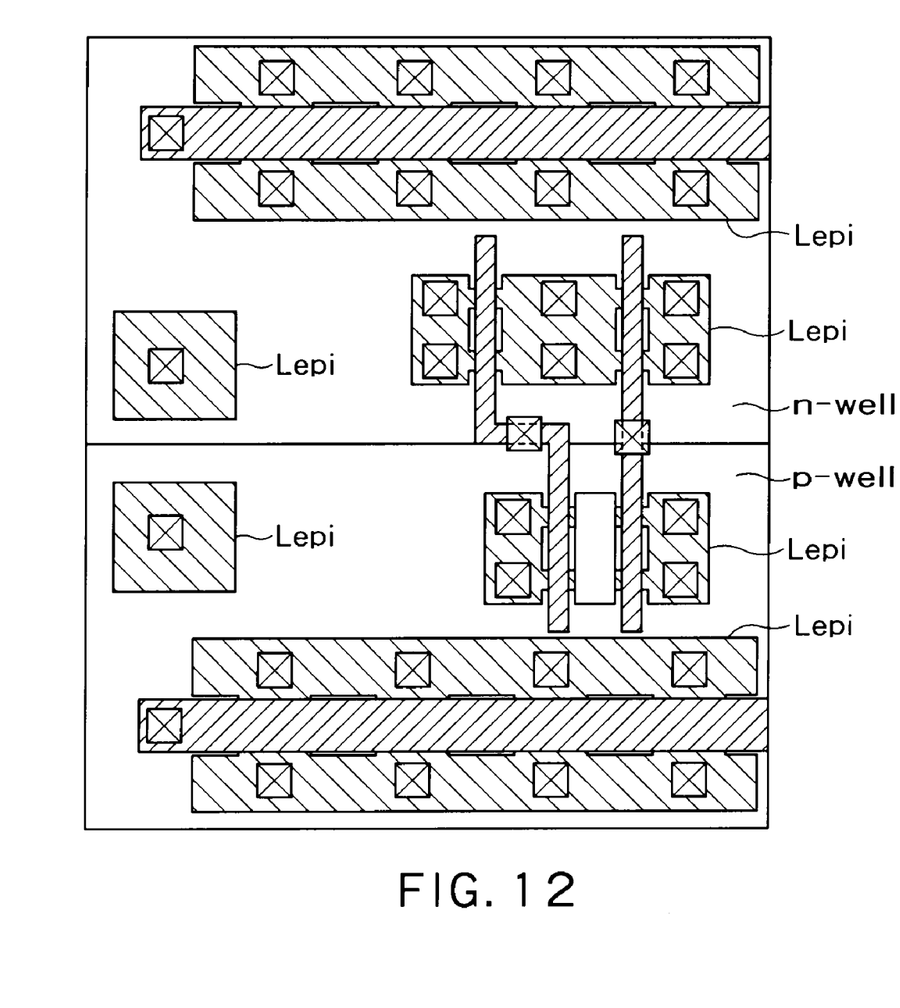
FIG. 12 is a layout view for explaining a first modification of the second embodiment.

FIG. 12 is a layout view for explaining a first modification of the second embodiment. In the first modification, after sources S and drains D are formed, a silicon layer is epitaxially grown with respect to Fin regions. By doing so, an epitaxial layer Lepi is formed in an epitaxial region shown in FIG. 12. As a result, the epitaxial layer Lepi can bury Fin-Fin gaps between adjacent Fin regions.

Next, impurities are implanted into the epitaxial layer Lepi. The epitaxial layer Lepi thereby connects adjacent contacts or adjacent Fin region at low resistance. For example, the epitaxial layer Lepi connects two adjacent source contacts SC to each other at low resistance. Likewise, the epitaxial layer Lepi connects two adjacent drain contacts DC at low resistance. Nevertheless, the source contacts SC and the drain contacts DC separated from one another by the gate electrode G are kept isolated from one another.

Thereafter, to reduce contact resistance, a surface of the epitaxial layer Lepi is silicided. Thereafter, similar steps to those in the second embodiment are performed and a semiconductor according to the first modification is completed. It is to be noted that a broken-line part Lepi shown in FIG. 9 corresponds to a plane position of the epitaxial layer Lepi.

Normally, a high resistance region is present in an interface between each contact SC or DC and a channel part. However, according to this modification, a source-drain resistance can be reduced because the epitaxial layer Lepi is formed to be quite close to the gate electrode G. As a result, current driving capability of a power supply circuit PSC improves. Furthermore, a logic circuit LC can operate at a higher operating rate.

Second Modification

While a bulk substrate is employed in the above embodiments, in a second modification, an SOI substrate having a thin BOX layer can be used. In the second modification, threshold voltages of switching transistors SWp and SWn can be controlled by applying a substrate bias voltage Vbs_nw or Vbs_pw to a silicon substrate under the BOX layer. While production costs are increased, in other aspects, effects identical to those of the first and second embodiments can be achieved in the second modification.

Third Modification

In a third modification, a mode of causing a logic circuit LC to operate in an intermediate state between an on-state and an off-state of each of switching transistors SWp and SWn can be set. For example, by reducing current drive of a power supply circuit PSC to be lower than that in high-speed operation, a logic circuit LC can be caused to operate at a lower operating speed.

Although not explained in detail in the above embodiments, a substrate voltage can be applied to a semiconductor substrate based either on a signal from a controller formed in the same semiconductor chip or on a signal from a controller formed in a different chip.

Embodiments of the invention have been described with reference to the examples. However, the invention is not limited thereto. Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

The invention claimed is:

1. A semiconductor device comprising:
a semiconductor substrate;
an electric circuit comprising a first transistor in a first Fin region on the semiconductor substrate;
a power supply circuit in a second Fin region on the semiconductor substrate, the power supply circuit comprising a second transistor connected between the electric circuit and a power supply line, wherein an on/off state of the second transistor controls a total voltage provided to a source of the first transistor, such that when the second transistor is in an on state, voltage from the power supply line is provided to the source of the first transistor, and when the second transistor is in an off state, only a first power supply voltage connected to the source of the first transistor provides voltage to the source of the first transistor; and
a substrate contact electrically connected to the semiconductor substrate and configured to apply a substrate voltage to the semiconductor substrate,
wherein a Fin width of the first Fin region in a cross section of the first Fin region perpendicular to a channel length direction of the first transistor is equal to or smaller than a twofold of a largest depletion region width of a depletion layer formed in a channel part of the first transistor, and
a Fin width of the second Fin region in a cross section of the second Fin region perpendicular to a channel length direction of the second transistor is larger than a twofold of a largest depletion layer width of a depletion layer in a channel part of the second transistor.

2. The device of claim 1, wherein
the first transistor configured to function as a fully-depleted transistor, and
the second transistor configured to function as a partially-depleted transistor having a body electrically connected to the substrate contact.

3. The device of claim 2, further comprising a first controller configured to apply a first substrate voltage to the semiconductor substrate via the substrate contact in order to reduce a threshold voltage of the second transistor when the electric circuit is driven.

4. The device of claim 2, further comprising a second controller configured to apply a second substrate voltage to the semiconductor substrate via the substrate contact in order to increase a threshold voltage of the second transistor when the electric circuit is on standby or stopping.

5. The device of claim 2, wherein a longitudinal direction of the first Fin region is substantially in parallel to a longitudinal direction of the second Fin region.

6. The device of claim 2, wherein a longitudinal direction of the first Fin region is substantially in perpendicular to a longitudinal direction of the second Fin region.

7. The device of claim 6, further comprising an epitaxial layer provided in each of the first Fin region and the second Fin region, a source and a drain regions of each of the first and the second transistors being provided in the first Fin region and the second Fin region.

8. The device of claim 1, further comprising a first controller configured to apply a first substrate voltage to the semiconductor substrate via the substrate contact in order to reduce a threshold voltage of the second transistor when the electric circuit is driven.

9. The device of claim 8, further comprising a second controller configured to apply a second substrate voltage to the semiconductor substrate via the substrate contact in order to increase a threshold voltage of the second transistor when the electric circuit is on standby or stopping.

10. The device of claim 9, wherein
the first transistor configured to function as a fully-depleted transistor, and
the second transistor configured to function as a partially-depleted transistor having a body electrically connected to the substrate contact.

11. The device of claim 8, wherein a longitudinal direction of the first Fin region is substantially in parallel to a longitudinal direction of the second Fin region.

12. The device of claim 8, wherein a longitudinal direction of the first Fin region is substantially in perpendicular to a longitudinal direction of the second Fin region.

13. The device of claim 12, further comprising an epitaxial layer provided in each of the first Fin region and the second Fin region, a source and a drain regions of each of the first and the second transistors being provided in the first Fin region and the second Fin region.

14. The device of claim 1, further comprising a second controller configured to apply a second substrate voltage to the semiconductor substrate via the substrate contact in order to increase a threshold voltage of the second transistor when the electric circuit is on standby or stopping.

15. The device of claim 14, wherein a longitudinal direction of the first Fin region is substantially in parallel to a longitudinal direction of the second Fin region.

16. The device of claim 1, wherein an effective channel width of the second transistor is larger than an effective channel width of the first transistor.

17. The device of claim 1, wherein an effective channel length of the second transistor is equal to or larger than an effective channel length of the first transistor.

18. The device of claim 1, wherein a longitudinal direction of the first Fin region is substantially in parallel to a longitudinal direction of the second Fin region.

19. The device of claim 1, wherein a longitudinal direction of the first Fin region is substantially in perpendicular to a longitudinal direction of the second Fin region.

20. The device of claim 19, further comprising an epitaxial layer provided in each of the first Fin region and the second Fin region, a source and a drain regions of each of the first and the second transistors being provided in the first Fin region and the second Fin region.

21. The device of claim 1, wherein the source of the first transistor is only connected to the first power supply voltage and the second transistor.

* * * * *